United States Patent
Gould

(10) Patent No.: US 6,184,564 B1
(45) Date of Patent: Feb. 6, 2001

(54) SCHOTTKY DIODE WITH ADJUSTED BARRIER HEIGHT AND PROCESS FOR ITS MANUFACTURE

(75) Inventor: Herbert J. Gould, Hawthorne, CA (US)

(73) Assignee: International Rectifier Corp., El Segundo, CA (US)

( * ) Notice: Under 35 U.S.C. 154(b), the term of this patent shall be extended for 0 days.

(21) Appl. No.: 09/221,627

(22) Filed: Dec. 28, 1998

(51) Int. Cl.[7] .......................... H01L 21/34; H01L 29/872
(52) U.S. Cl. .......................... 257/486; 438/575; 438/581; 438/583
(58) Field of Search ........................ 438/575, 581, 438/582, 583, 576, 573; 257/486, 751, 763, 473, 484, 582, 576

(56) References Cited

U.S. PATENT DOCUMENTS

| | | | |
|---|---|---|---|
| 4,063,964 | * 12/1977 | Peressini et al. | 148/1.5 |
| 4,206,540 | * 6/1980 | Gould | 29/590 |
| 4,398,344 | * 8/1983 | Gould | 29/590 |
| 4,408,216 | * 10/1983 | Gould | 357/15 |
| 4,692,991 | * 9/1987 | Gould | 437/175 |
| 4,864,378 | * 9/1989 | Tsaur | 357/30 |
| 5,888,891 | * 3/1999 | Gould | 438/575 |

* cited by examiner

Primary Examiner—Mary Wilczewski
Assistant Examiner—David Goodwin
(74) Attorney, Agent, or Firm—Ostrolenk, Faber, Gerb & Soffen, LLP

(57) ABSTRACT

A schottky diode is formed of a sintered barrier metal layer which contacts a lightly doped silicon surface. The barrier metal layer is formed of palladium as well as a small quantity of another metal whose choice is determined by the desired value of the barrier height of the resulting schottky diode. A small quantity of platinum is selected to increase the barrier height, and a small quantity of nickel is selected to decrease the barrier height. A contact metal, which may include a tri-metal layer of titanium, nickel and silver, is formed atop the sintered schottky barrier layer. The resulting process also allows for control of reverse hot leakage current.

7 Claims, 2 Drawing Sheets

US 6,184,564 B1

SCHOTTKY DIODE WITH ADJUSTED BARRIER HEIGHT AND PROCESS FOR ITS MANUFACTURE

BACKGROUND OF THE INVENTION

The present invention relates to schottky diodes and, more specifically, to a novel process for their manufacture in which the barrier height is adjusted to a desired value.

Schottky diodes and processes for their manufacture are well known. For example, U.S. Pat. No. 4,206,540 and its divisional U.S. Pat. No. 4,408,216, as well as U.S. Pat. Nos. 4,398,344 and 4,849,199 and application Ser. No. 08/701,847, describe processes for the manufacture of a schottky diode in which a palladium and/or platinum silicide barrier is used as the schottky barrier to a silicon substrate.

An important characteristic of the schottky diode is its barrier height or turn-on voltage, sometimes called its knee voltage. Another important characteristic of a schottky diode is its hot reverse leakage current. Typically, low hot reverse leakage currents are desirable, such as five milliamperes per square millimeter at 125° C.

The known processes for the manufacture of a schottky diode typically attain a barrier height or knee voltage that is fixed and which cannot be changed by the respective process.

For example, a known process for the manufacture of a schottky diode includes a molybdenum to silicon barrier which allows for variations in the resistivity and thickness of epitaxial layer in the upper surface to obtain a targeted blocking voltage and to allow for variations in the die dimensions for targeted current and heat dissipation ranges. The knee voltage for this process is fixed at 0.30 volts.

Another known process for forming a schottky diode uses an ultra-thin palladium-diffused layer formed in the upper surface of the epitaxial layer and upon which a molybdenum film is applied. Such a process is described in U.S. Pat. Nos. 4,206,540 and 4,408,216. The process also allows for variations in the epitaxial layer of resistivity and thickness and attains a targeted blocking voltage with allowed variations and die dimensions for targeted current and heat dissipation ranges. The knee voltage attained using this process is similarly fixed at 0.36 volts.

Though a 0.30 volt or 0.36 volt knee voltage is suitable for many applications, other applications optimally require a schottky diode having other knee voltages and thus require design compromises to use one of the above schottky diodes.

It is therefore desirable to have a process for the manufacture of a schottky diode in which the barrier height can be tailored to the optimal level suitable for a respective application.

SUMMARY OF THE INVENTION

The present invention provides for a schottky diode having a palladium silicide on silicon barrier in which the barrier height is adjusted by adding a small quantity of another metal during the deposition of the palladium. The added metal raises or lowers the barrier height of the device.

In accordance with the invention, a schottky diode device and a process for its manufacture includes a silicon body. A metal silicide layer is formed atop at least a portion of the surface of the silicon body and forms a schottky barrier to the silicon body. The metal silicide layer is comprised of palladium and of a small quantity of another metal. The choice of added metal is determined based on a desired value of the barrier height of the schottky diode. A contact metal is formed atop the upper surface of the metal silicide layer.

The added metal may be either nickel or platinum, with the barrier height being greater than an ordinary palladium silicide device when the metal is platinum and less than an ordinary palladium silicide device when the metal is nickel.

In accordance with another aspect of the invention, a field oxide layer is grown or deposited atop a surface of an N– epitaxially deposited silicon layer formed atop a more heavily doped body portion. An annular window is opened in the field oxide layer, and a P+ guard ring is formed in the silicon layer in the annular window. A portion of the field oxide is located within a region enclosed by the annular window is removed. A barrier metal layer is deposited in the manner described above and is sintered with a portion of the silicon layer contacted thereby to form a silicide schottky barrier to the silicon located beneath the silicide. A contact metal is formed atop an upper surface of the metal silicide and silicon schottky barrier and is connected to the guard ring.

A major advantage of the invention is that a range of barrier heights and knee voltages are attained using one basic process in which only change is the choice of metal added to the palladium silicide to silicon junction to attain a barrier height that is less than or greater than that attained using a pure palladium silicide barrier.

Another advantage of the invention is that the junction is buried and is thus more forgiving of variations of the surface chemistry and processing. Thus, the process is very reproducible in a production environment.

As a further advantage, the process of the present invention produces a high yield of schottky diodes.

Moreover, when a higher barrier height device is formed using the present invention, the process need 15 not generate a corresponding higher forward voltage drop.

The higher barrier height device has, at higher current levels, a better dynamic impedance so that the device has a lower $V_{ON}$ than known devices.

Other features and advantages of the present invention will become apparent from the following description of the invention which refers to the accompanying drawings.

BRIEF DESCRIPTION OF THE DRAWINGS

The invention will now be described in greater detail in the following detailed description with the reference to the drawings in which.

DETAILED DESCRIPTION OF THE INVENTION

Figure 1:
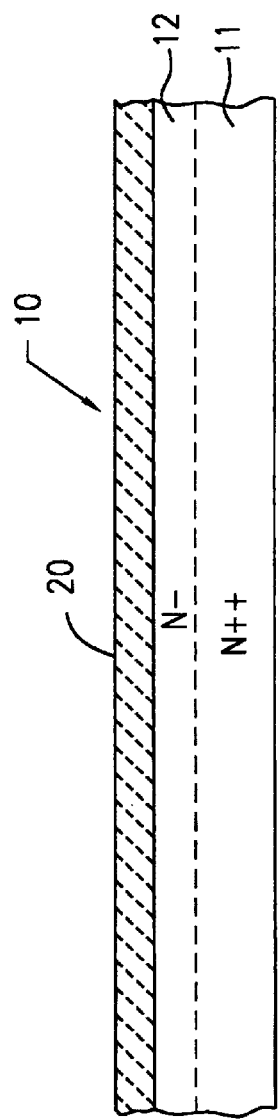
FIG. 1 is a cross-section through a portion of a silicon chip which is to be processed in accordance with the present invention.

Referring first to FIG. 1, there is shown, in cross-section, a chip 10 which can be a thin monocrystalline silicon chip which is part of a larger wafer in which a plurality of identical chips can be simultaneously processed. Chip 10 has an N+ body 11 and an N− expitaxially deposited layer 12 thereon. As a typical example, for a schottky diode with a reverse blocking voltage rating of 45 volts, the wafer 10 is preferably of [1-1-1] silicon having an arsenic doped N+ body 11 which is about 300 microns thick, and an N− phosphorus doped epitaxial layer 12 which is about 5 to 6 microns thick.

The [1-1-1] orientation is preferred because the solid state epitaxy that results will be a single crystal film. Other orientations have been found to produce a polycrystalline film with leaky grain boundaries. The [1-1-1] orientation is also preferred because the mechanical strength of [1-1-1] oriented material is greater than that of other orientations which allows for a thinner substrate with greater thermal dissipation and lower substrates $I^2R$. The lower substrate $I^2R$ is particularly advantageous because schottky diodes often carry high current densities.

In a first process step, a field oxide 20 is grown atop the N− layer 12. Thereafter, in a first mask step, a polygonal ring-shaped window 21 is etched in the oxide 20 to expose the silicon surface. Boron is then implanted into the window 21 and a boron P type implant is then diffused in a drive in step to form P+ guard ring 22.

Figure 2:
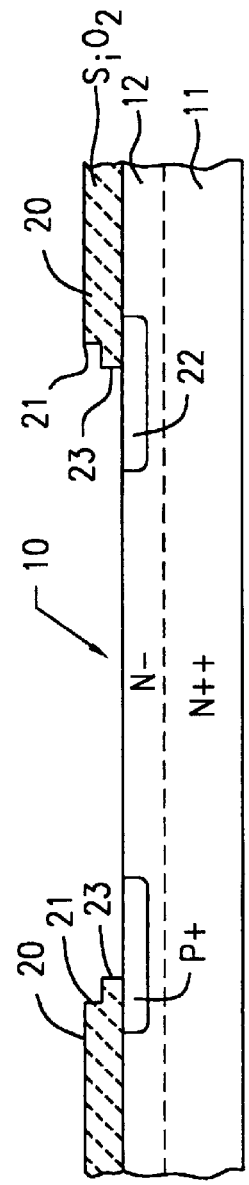
FIG. 2 shows the chip of FIG. 1 after the growth of a field oxide and the diffusion of a guard ring.

A new layer of oxide is grown over the silicon surface in window 21 during the P+ guard ring 22 diffusion. This oxide is etched in a second mask step to expose the schottky window 23 also shown in FIG. 2. After the schottky window 23 is formed, a silicon etch is used to etch a portion of the exposed silicon surface.

Figure 3:
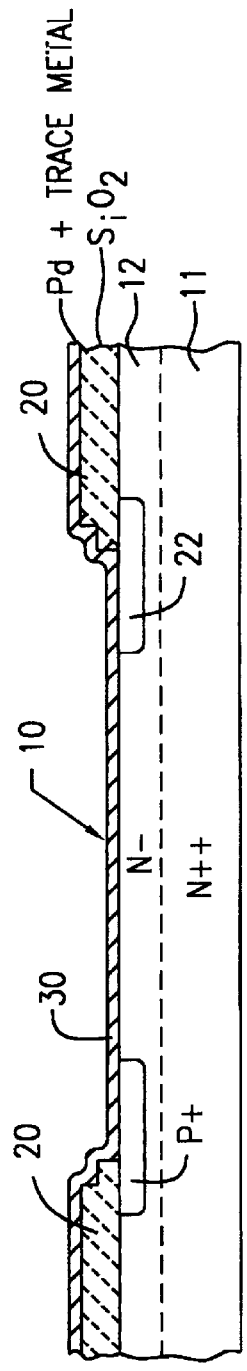
FIG. 3 shows the chip of FIG. 2 after the deposition of a barrier metal layer.

Thereafter, and as shown in FIG. 3, a layer 30 of palladium is E-beam deposited in vacuum to a thickness of about 500 Å. Then, and in accordance with the invention, a small quantity of platinum or nickel is E-beam deposited atop the palladium, preferably without breaking vacuum, using a multi-hearth electron gun. If a reduction in the barrier height is desired, and thus a reduction in knee voltage, a small quantity of nickel is deposited atop the palladium. Alternatively, if an increase in the barrier height and knee voltage is desired, a small quantity of platinum is deposited atop the palladium. It should also be noted that the small quantity of platinum or nickel may be deposited concurrent with the deposition of the palladium.

Typically, about 50 to 100 Å of nickel or platinum is deposited atop the palladium layer. However, the change in barrier height does not vary with the amount of nickel or platinum and thus the thickness is not critical.

Figure 4:
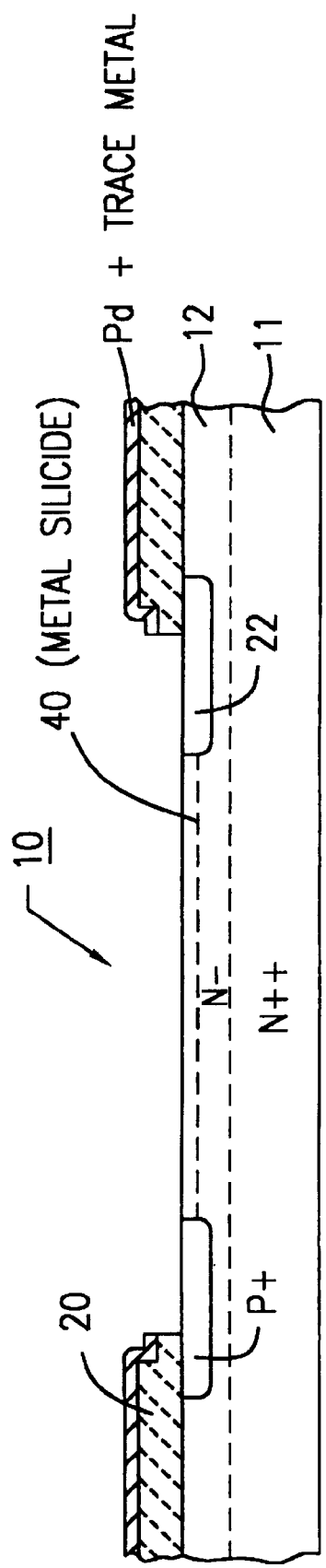
FIG. 4 shows the chip of FIG. 3 after the heating of the chip to form a non-stoichiometric silicide interface and silicide schottky barrier, and after the formation of a very thin oxide layer atop the silicide surface.

The chip 10 or its wafer is then placed in a diffusion furnace filled with a suitable forming gas and is heated to form a silicide 40 shown in FIG. 4 and which is a solid phase epitaxy silicide layer. Silicide 40 forms a non-stoichiometric silicide interface to silicon 12. Note that the silicide 40 will be immune to subsequent assembly operation bonding temperatures, such as die attach, which are much less than the sintering temperature.

Thereafter, the unreacted metal atop the field oxide 20 is removed by a photolithograpic masking step and a suitable etch.

Figure 5:
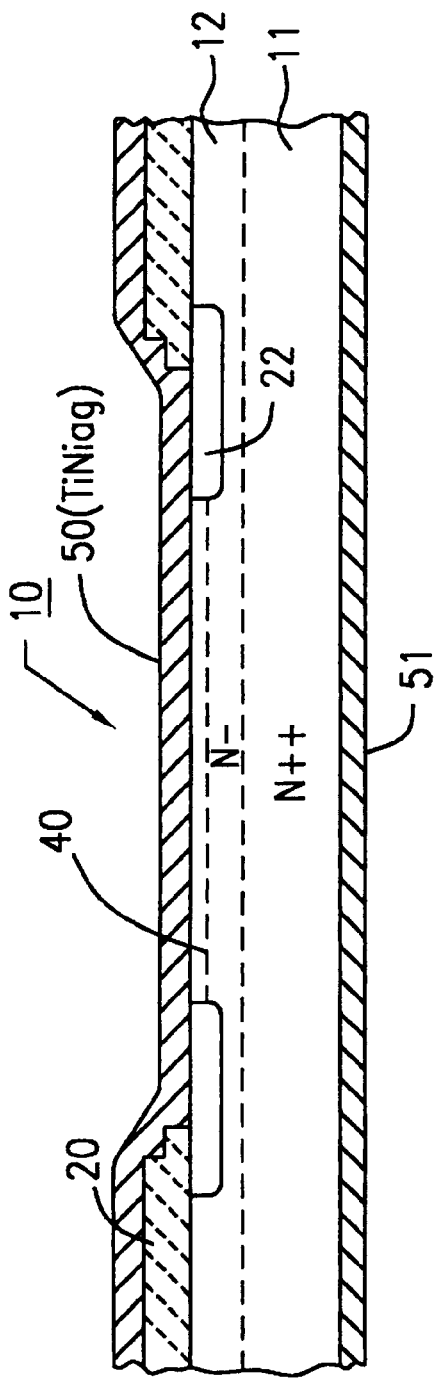
FIG. 5 shows the chip of FIG. 4 after the removal of the oxide layer and the formation of contact layers.

As next shown in FIG. 5, oxide layer 41 is removed such as using an etch in dilute HF (100 parts water to 1 part HF) for about 30 seconds.

The wafer (and chip 10) is then rinsed and dried and a contact layer 50 is applied to the upper surface of chip 10 and to the silicide 41. Contact layer 50 may be a tri-metal layer comprising, for example, a 1000 Å thick bottom layer of titanium, a 3000 Å thick second layer of nickel, and a 35,000 Å thick uppermost silver layer. A conventional photoresist deposition and patterning, metal etch sequence and photoresist strip completes the front surface of the wafer. A suitable bottom contact layer 51 is also formed.

Advantageously, when a small quantity of platinum is added to the palladium layer, the result is a schottky diode that combines the advantages of a palladium silicide device with those of a platinum silicide device without the disadvantages ordinarily present in such devices.

Typically, platinum silicide schottky devices are impractical because of poor yields. The platinum is a noble metal and when it is E-beam deposited on the silicon substrate, it will not readily form a silicide layer because any surface oxide present interferes with the formation of the silicide.

By contrast, palladium is a much better reducer of silicon dioxide and more readily forms a silicide. By adding platinum to the palladium layer, the platinum follows the palladium as the palladium reacts with the oxide, and both metals react with the silicon. The resulting device incorporates the properties of the platinum but with the high yields of a palladium silicide device.

The device of the invention also allows a reduction in the reverse leakage current.

As an example, for a molybdenum on silicon barrier die formed using known processes and having a 180×180 mil window, the reverse hot leakage current at 45 volts and at a junction temperature of 125° C. is about $I_R$=100 mA. A similarly dimensioned device having a molybdenum on silicon structure with diffused palladium has an $I_R$ of 15 mA.

Further, when a purely palladium silicide barrier layer is formed without adding platinum or nickel, the hot reverse leakage current is about 40 mA. However, the knee voltage is fixed.

By contrast, when a small quantity of platinum is introduced into a palladium device in accordance with the invention, the reverse leakage current is 1 microamp when a trilevel Ti—Ni—Ag contact metal is used and has a reverse leakage current of 400–600 microamps when a tri-metal on molybdenum contact is used.

It should be noted that there is a trade-off between the barrier height/knee voltage and hot reverse leakage current. Thus, when the barrier height is reduced in accordance with the invention, the hot leakage current increases, whereas when the barrier height is raised in accordance with the invention, there is a reduction in the hot leakage current.

It should also be noted that the higher barrier voltage device attained by adding the small quantity of platinum does not necessarily result in a higher forward voltage drop because the devices of the present invention have a better dynamic impedance. As a result, the devices of the present invention have a lower VON than known devices.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A schottky diode device comprising:
 a silicon body;
 a metal suicide layer formed atop at least a portion of a surface of said silicon body and which forms a schottky barrier to said silicon body, said metal silicide layer being comprised of palladium and another metal, said another metal being selected as a function of a desired value of the barrier height of said schottky diode, said another metal further being selected from the group consisting of nickel and platinum; and a contact metal formed atop an upper surface of said metal silicide layer.

2. The device of claim 1 wherein said another metal is platinum, and the barrier height of said schottky diode is greater than if said another metal were not added.

3. The device of claim 1 wherein said another metal is nickel, and the barrier height of said schottky diode is less than if said another metal were not added.

4. The device of claim 1 wherein said silicon body includes a lightly doped N– expitaxial layer formed atop a more heavily doped body portion.

5. The device of claim 4 which further includes a P type guard ring formed in said N– layer which encloses said schottky barrier and which is connected to said contact metal.

6. The device of claim 5 which further includes a field oxide region formed atop said N– layer which surrounds and partially overlaps said guard ring.

7. The device of claim 1 wherein said contact metal layer is comprised of a tri-metal layer of titanium, nickel and silver.

* * * * *